United States Patent
Takasoh et al.

(10) Patent No.: US 7,050,524 B2
(45) Date of Patent: May 23, 2006

(54) HALF-RATE CLOCK AND DATA RECOVERY CIRCUIT

(75) Inventors: Jun Takasoh, Tokyo (JP); Kimio Ueda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 806 days.

(21) Appl. No.: 10/212,779

(22) Filed: Aug. 7, 2002

(65) Prior Publication Data

US 2003/0142774 A1    Jul. 31, 2003

(30) Foreign Application Priority Data

Jan. 28, 2002  (JP) .............................. 2002-018210

(51) Int. Cl.
*H03D 3/24* (2006.01)

(52) U.S. Cl. ..................... 375/375; 373/374; 373/376
(58) Field of Classification Search ................ 375/375, 375/373, 374, 376
See application file for complete search history.

(56) References Cited

U.S. PATENT DOCUMENTS 6,847,789 B1 * 1/2005 Savoj .......................... 398/155

OTHER PUBLICATIONS

Nakamura, Kazuyoki et al.; "A 6 Gps CMOS Phase Detecting DEMUX Module Using Half-Frequency Clock", Symposium on VLSI Circuits Digest of Technical Papers, p. 196 (1998).

"A 10-GB/S Linear Half-Rate CMOS CDR Circuit", High-Speed CMOS Circuits for Optical Receivers, pp. 77-93.

* cited by examiner

*Primary Examiner*—Kevin Burd
*Assistant Examiner*—Juan Alberto Torres
(74) *Attorney, Agent, or Firm*—Leydig, Voit & Mayer, Ltd.

(57) ABSTRACT

A half-rate clock and data recovery circuit includes a phase detector capable of operating at a half-rate, a charge pump circuit, a low pass filter, and a voltage controlled oscillator. The phase detector includes a selector circuit which receives uninverted and inverted signals from respective latches of the phase detector and an uninverted and inverted half-rate clock and outputs uninverted and inverted retimed signals supplied to the charge pump so that the charge pump produces a full-rate output in response to a half-rate input. The circuit provides greater operating margin.

4 Claims, 7 Drawing Sheets

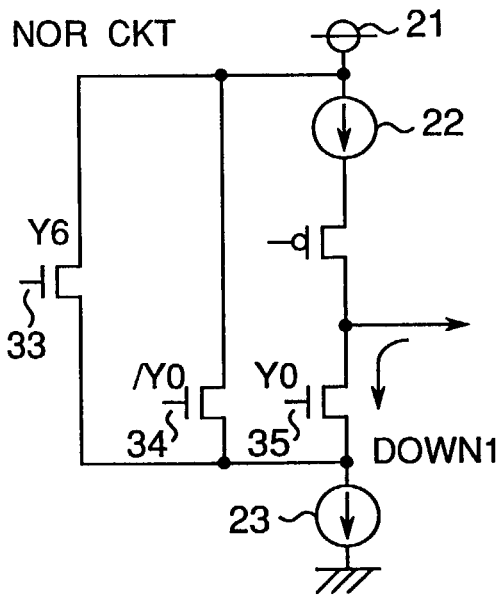
Fig.7A NOR CKT
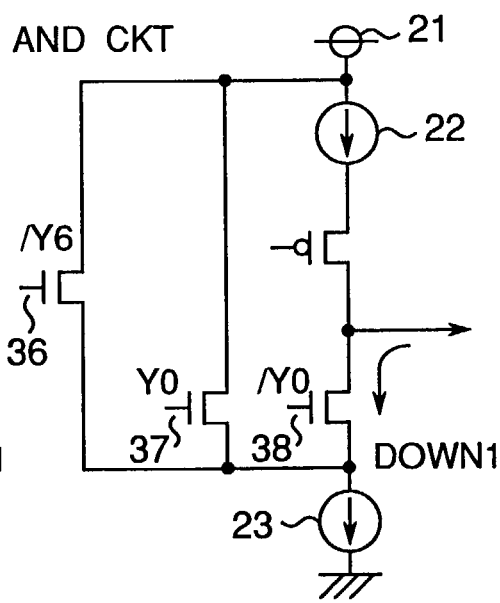
Fig.7B AND CKT
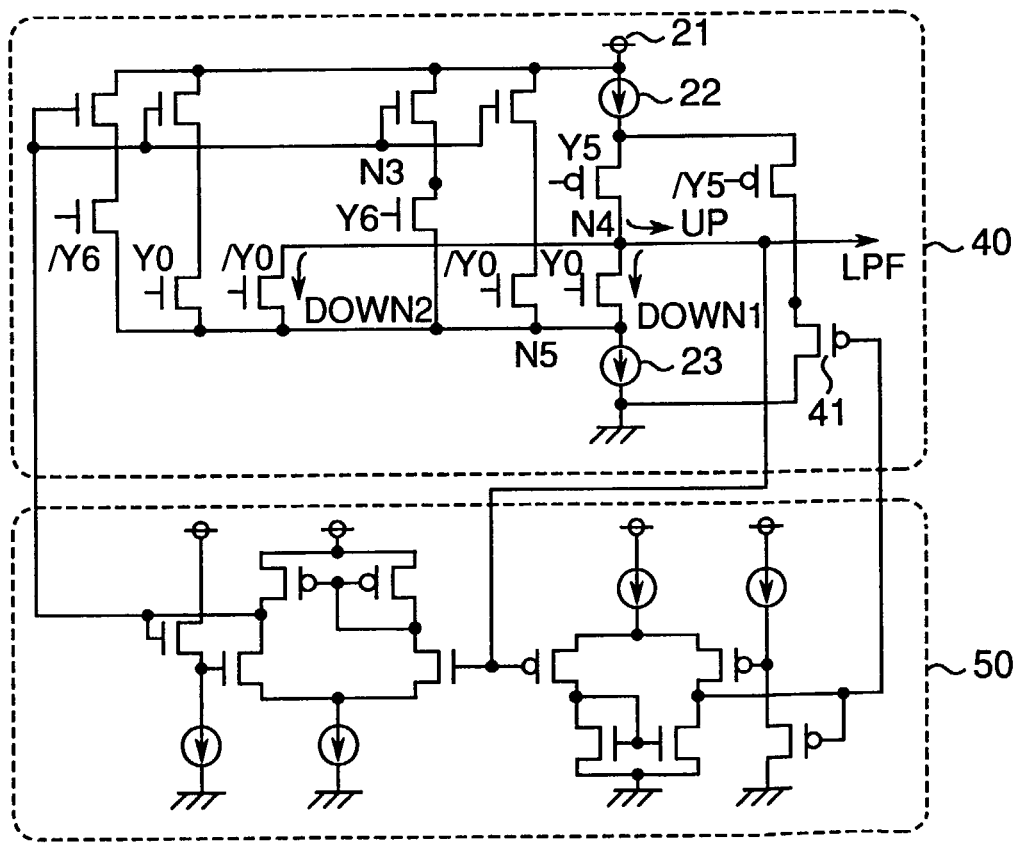
Fig.8

HALF-RATE CLOCK AND DATA RECOVERY CIRCUIT

BACKGROUND OF THE INVENTION

1. Field of the Invention

The present invention relates to a half-rate clock and data recovery (CDR) circuit in which constituent elements operate at a half rate of 5 GHz equal to a half of a full rate of 10 GHz.

2. Description of the Prior Art

In response to recent high-speed trends of optical communication network, there is a demand for a CDR circuit operating at a data transfer rate of not less than 10 Gbits/sec. (Gbps). Conventionally, if a CDR circuit formed by CMOS process is operated at a high data transfer rate of not less than 10 Gbps, the constituent transistors should operate at the full rate of 10 GHz.

On the other hand, some receiver chips formed by the CMOS process are produced by a half-rate circuit technique so as to operate at the half rate of 5 GHz. This half-rate circuit technique is considered to be a technique necessary for operating the CDR circuit at high speed by the CMOS transistors.

FIG. 13 shows one example of a whole configuration of a conventional CDR circuit. The conventional CDR circuit includes a phase detector 110, a charge pump circuit 120, a low-pass filter (LPF) 130 and a voltage controlled oscillator (VCO) 140 which are connected to each other in series in this order. The phase detector 110 detects a phase difference between a reference signal Sref and an oscillation signal So fed back by the VCO 140 and outputs to the charge pump circuit 120 a signal Spd corresponding to the phase difference. The signal Spd from the phase detector 110 is converted into a ternary signal, i.e., a three-valued signal St by the charge pump circuit 120. Then, the LPF 130 integrates the ternary signal St from the charge pump circuit 120 so as to generate a control voltage Vc for controlling the VCO 140. Furthermore, the VCO 140 outputs to the phase detector 110 the oscillation signal So having a frequency corresponding to the control voltage Vc.

FIG. 14 is a circuit diagram of the phase detector 110 employed in the conventional CDR circuit of FIG. 13 and FIG. 15 is a timing chart of signals of the conventional phase detector 110. In FIG. 15, dotted lines indicate several waveforms which the signals of the conventional phase detector 110 can take. The conventional phase detector 110 includes first and second latch circuits 151 and 153, further first and second latch circuits 152 and 154, an exclusive OR circuit 155 for outputting an error signal Error and an exclusive OR circuit 156 for outputting a reference signal Ref. The first latch circuit 151 receives an input signal Data, an inverted input signal/Data and a half-rate clock CLK, while the further first latch circuit 152 receives the input signal Data, the inverted input signal/Data and an inverted half-rate clock/CLK. The second latch circuit 153 receives the inverted half-rate clock/CLK, while the further second latch circuit 154 receives the half-rate clock CLK.

As will be apparent from waveforms of the error signal Error and the reference signal Ref shown in FIG. 15, operating speed of the exclusive OR circuit 155 for the error signal Error is higher than that of the exclusive OR circuit 156 for the reference signal Ref. Pulses of hatched portions in the signals X1 and X2 in FIG. 15 are necessary for inputting to the exclusive OR circuit 155 a signal X1 outputted from an output terminal Q of the first latch circuit 151 and a signal X2 outputted from an output terminal Q of the further first latch circuit 152. Thus, the exclusive OR circuit 155 requires a full-rate switching speed in order to receive the full-rate pulses of the hatched portions in the signals X1 and X2. Hence, in the phase detector 110 of the conventional CDR circuit, the first latch circuit 151, the further first latch circuit 152 and the exclusive OR circuit 155 should operate at the full rate.

Therefore, in the conventional phase detector 110 shown in FIGS. 14 and 15, since the exclusive OR circuit should operate at the full rate, such a problem arises that operating margin is small.

SUMMARY OF THE INVENTION

Accordingly, an essential object of the present invention is to provide, with a view to eliminating the above mentioned drawback of prior art, a half-rate CDR circuit which operates at a half rate so as to be capable of increasing operating margin.

In order to accomplish this object of the present invention, a half-rate CDR circuit according to the present invention includes a phase detector which is capable of operating at a half rate, a charge pump circuit, a low-pass filter and a voltage controlled oscillator. The phase detector includes a first latch circuit which receives an input signal, an inverted input signal and a half-rate clock so as to output a first output signal and an inverted first output signal, a second latch circuit which receives the first output signal and the inverted first output signal from the first latch circuit and an inverted half-rate clock so as to output a second output signal and an inverted second output signal, a further first latch circuit which receives the input signal, the inverted input signal and the inverted half-rate clock so as to output a further first output signal and an inverted further first output signal, a further second latch circuit which receives the further first output signal and the inverted further first output signal form the further first latch circuit and the half-rate clock so as to output a further second output signal and an inverted further second output signal, a selector circuit which receives the first output signal and the inverted first output signal form the first latch circuit and the further first output signal and the inverted further first output signal from the further first latch circuit, the half-rate clock and the inverted half-rate clock so as to output a retimed signal and an inverted retimed signal and an exclusive OR circuit which receives the second output signal and the inverted second output signal from the second latch circuit and the further second output signal and the inverted further second output signal from the further second latch circuit so as to output a reference signal and an inverted reference signal.

BRIEF DESCRIPTION OF THE DRAWINGS

This object and features of the present invention will become apparent from the following description taken in conjunction with the preferred embodiments thereof with reference to the accompanying drawings in which:

FIGS. 7A and 7B are circuit diagrams of a NOR circuit and an AND circuit usable in the half-rate charge pump circuit of FIG. 3, respectively;

FIG. 8 is a circuit diagram of a half-rate charge pump circuit employed in a half-rate CDR circuit according to a third embodiment of the present invention;

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

(First Embodiment)

Figure 1:
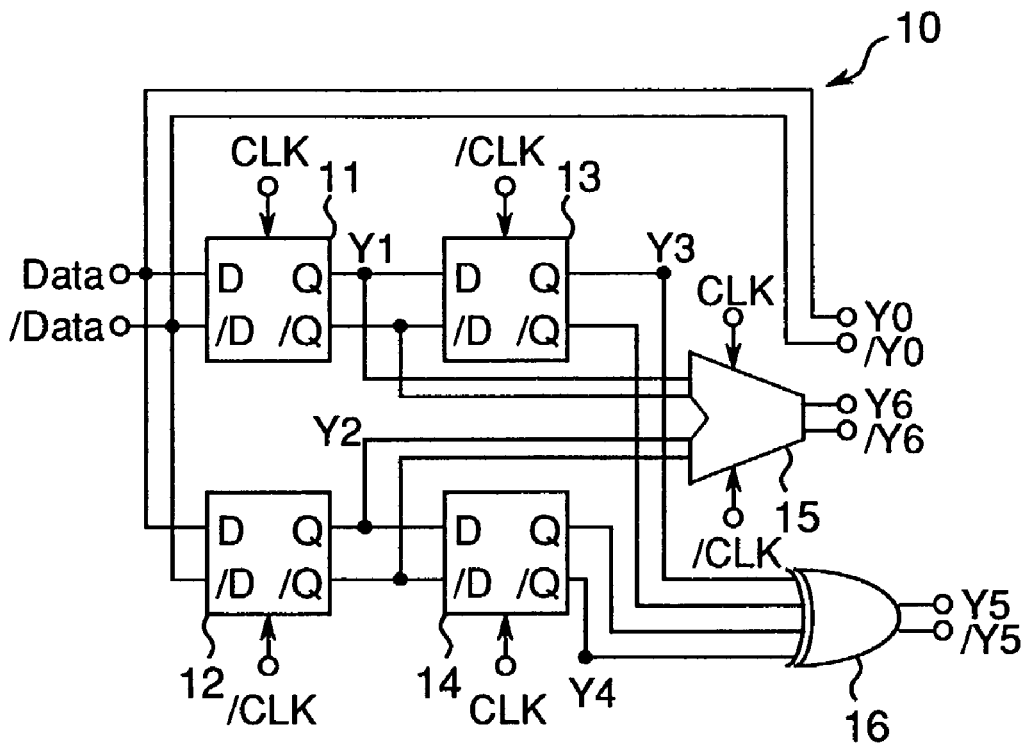
FIG. 1 is a circuit diagram of a half-rate phase detector employed in a half-rate CDR circuit according to a first embodiment of the present invention.
Figure 2:
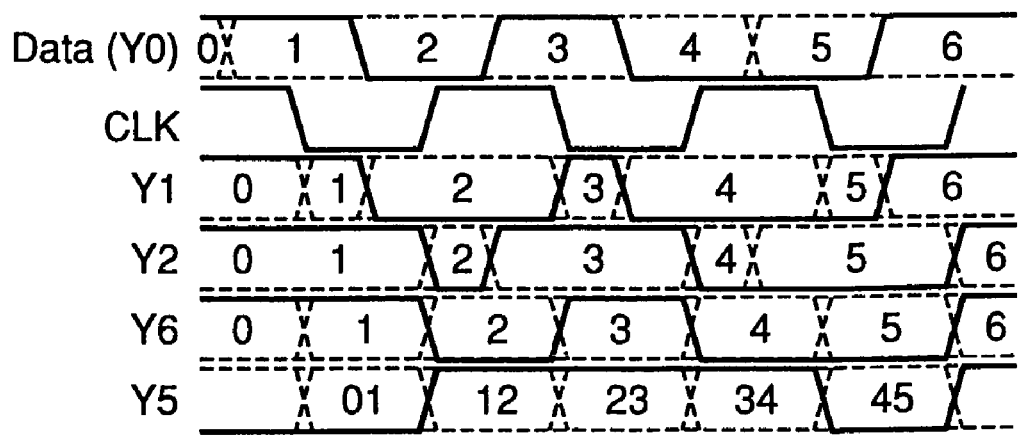
FIG. 2 is a timing chart of signals of the half-rate phase detector of FIG. 1.
Figure 14:
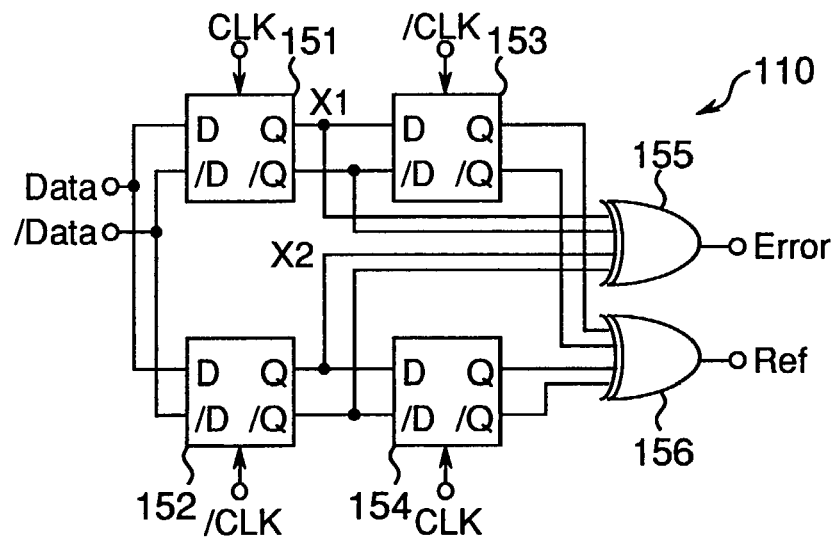
FIG. 14 is a circuit diagram of a phase detector employed in the prior art CDR circuit of FIG. 13.
Figure 15:
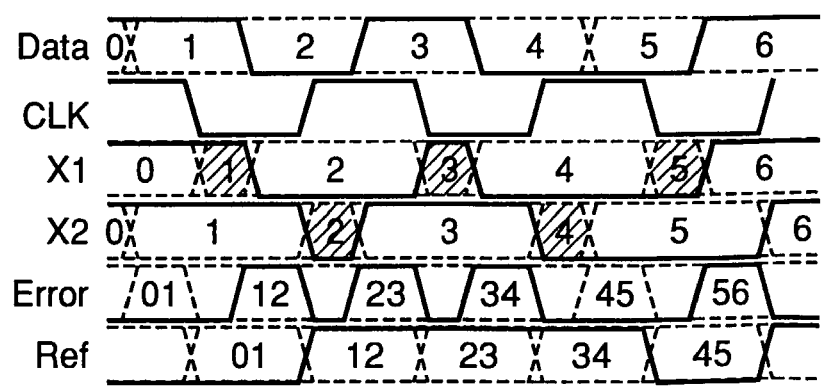
FIG. 15 is a timing chart of signals of the prior art phase detector of FIG. 14.

FIG. 1 is a circuit diagram of a half-rate phase detector 10 employed in a half-rate clock and data recovery (CDR) circuit according to a first embodiment of the present invention and FIG. 2 is a timing chart of signals of the half-rate phase detector 10. In FIG. 2, dotted lines indicate several waveforms which the signals of the half-rate phase detector 10 can take. In the half-rate phase detector 10, an exclusive OR circuit 155 for outputting an error signal Error in a conventional phase detector 110 shown in FIG. 14 is replaced by a selector circuit 15. The selector circuit 15 receives a half-rate clock CLK and an inverted half-rate clock/CLK and outputs a retimed signal Y6 and an inverted retimed signal/Y6. Since other configurations of the half-rate phase detector 10 are similar to those of the conventional phase detector 110 of FIG. 14, the description is abbreviated for the sake of brevity.

Therefore, the half-rate phase detector 10 further includes first and second latch circuits 11 and 13, further first and second latch circuits 12 and 14 and an exclusive OR circuit 16 for outputting a reference signal Y5 and an inverted reference signal/Y5. The first latch circuit 11 receives an input signal Data, an inverted input signal/Data and a half-rate clock CLK, while the further first latch circuit 12 receives the input signal Data, the inverted input signal/Data and an inverted half-rate clock/CLK. The second latch circuit 13 receives the inverted half-rate clock/CLK, while the further second latch circuit 14 receives the half-rate clock CLK. Meanwhile, the input signal Data and the inverted input signal/Data are, respectively, outputted as an output signal Y0 and an inverted output signal/Y0.

In the half-rate phase detector 10 of the above described configuration, signals Y1 and Y2 are, respectively, outputted from output terminals Q of the first latch circuit 11 and the further first latch circuit 12. Then, signals Y3 and Y4 are, respectively, outputted from an output terminal Q of the second latch circuit 13 and an output terminal/Q of the further second latch circuit 14. Opposite edges of each of the signals Y3 and Y4 are synchronous with phase of the half-rate clock CLK. In response to the signals Y3 and Y4, the exclusive OR circuit 16 outputs the reference signal Y5. The reference signal Y5 has a waveform in which neighboring signal portions 0 and 1, 1 and 2, 2 and 3, etc. of the input signal Data (=output signal Y0) are subjected to exclusive OR operation. Meanwhile, a pulse width of the reference signal Y5 is equal to a width of a half period of the half-rate clock CLK.

On the other hand, the selector circuit 15 is adapted not to select full-rate signal patterns and selects the signals Y1 and Y2 by the half-rate clock CLK so as to output the retimed signal Y6. As shown in FIG. 2, a waveform of the signal Y6 is identical with that of the input signal Data (=output signal Y0) and is synchronous with the phase of the half-rate clock CLK. Thus, the first latch circuit 11 and the further first latch circuit 12 may operate at a half rate.

Phase comparison is performed based on the signals Y6, Y0 and Y5. Phase comparison of the signals Y0 and Y5 is performed by a charge pump circuit provided downstream of the phase detector 10.

In this embodiment, since the first latch circuit 11, the further first latch circuit 12 and the selector circuit 15 operate at the half rate, the half-rate phase detector 10 is capable of operating at the half rate and thus, operating margin of the half-rate CDR circuit can be increased.

(Second Embodiment)

Figure 3:
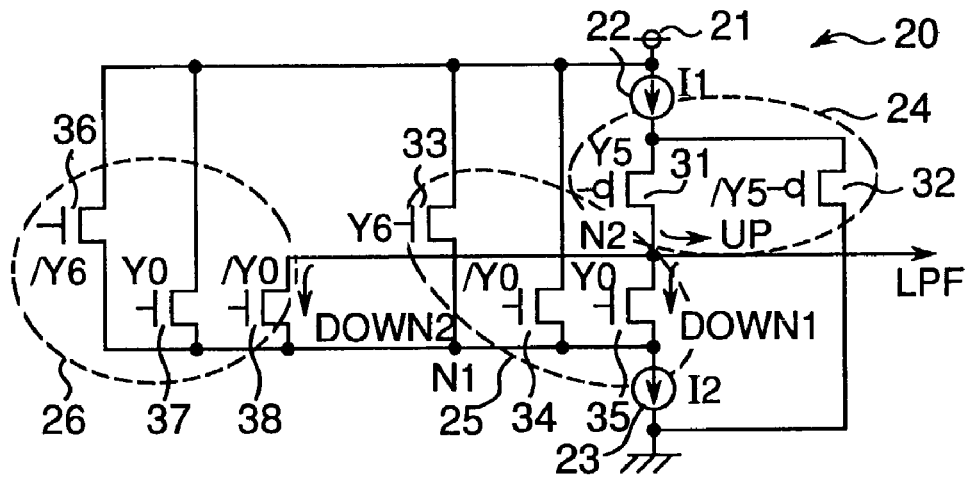
FIG. 3 is a circuit diagram of a half-rate charge pump circuit employed in a half-rate CDR circuit according to a second embodiment of the present invention.
Figure 4:
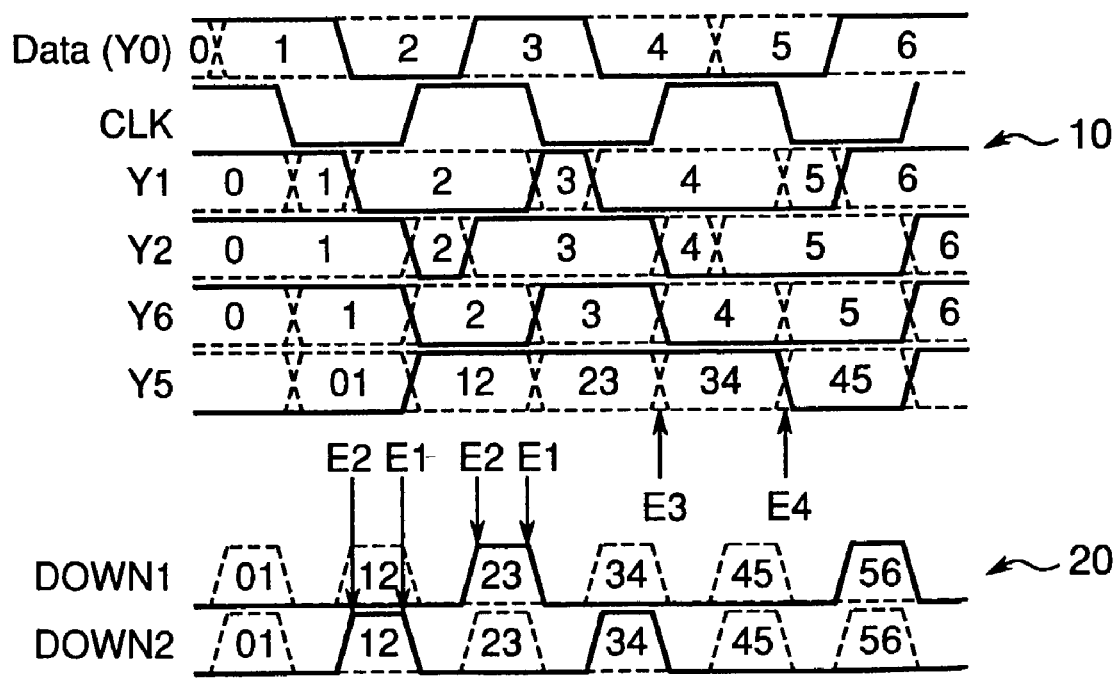
FIG. 4 is a timing chart of signals of the half-rate phase detector of FIG. 1 and the half-rate charge pump circuit of FIG. 3.
Figure 5:
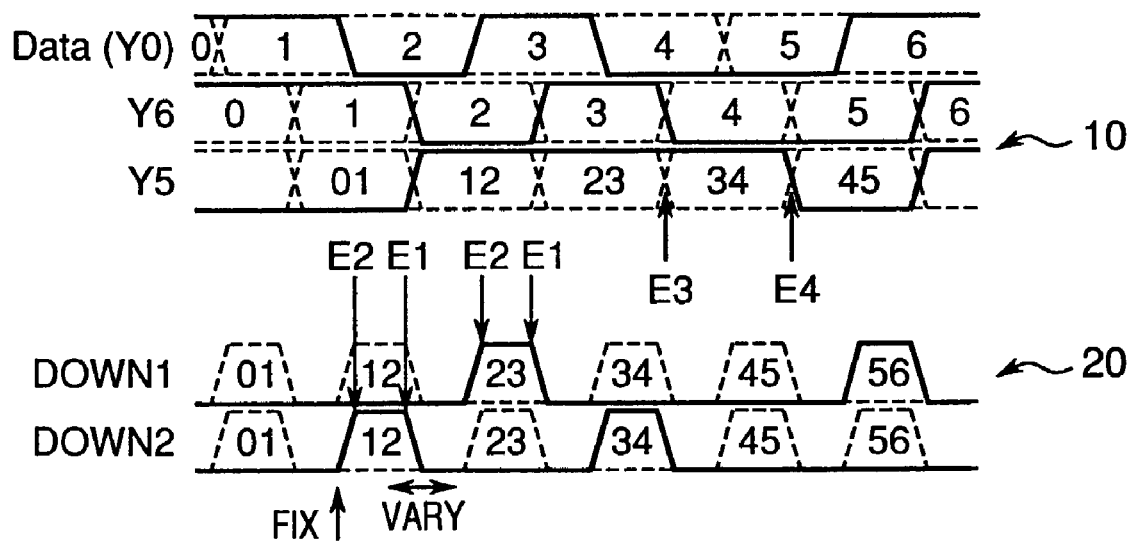
FIG. 5 is a view indicative of phase comparison principle of the half-rate CDR circuit of FIG. 3.
Figure 6:
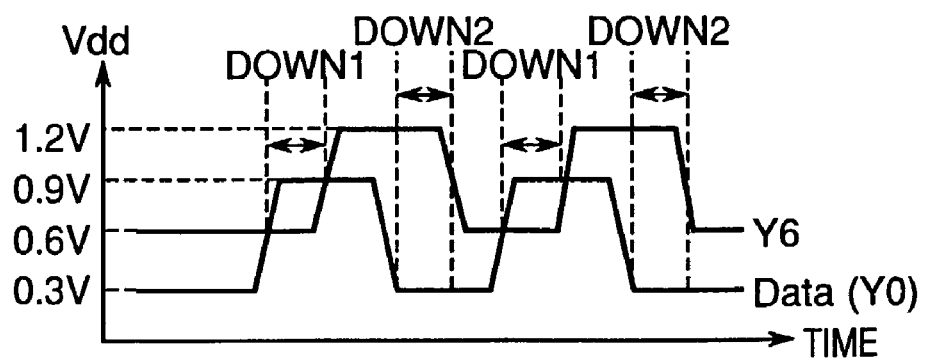
FIG. 6 is a timing chart of a pump-down signal of the half-rate charge pump circuit of FIG. 3.

FIG. 3 is a circuit diagram of a half-rate charge pump circuit 20 employed in a half-rate CDR circuit according to a second embodiment of the present invention and FIG. 4 is a timing chart of signals of the half-rate phase detector 10 of FIG. 1 and the half-rate charge pump circuit 20 of FIG. 3. FIG. 5 shows phase comparison principle of the half-rate CDR circuit of FIG. 3 and FIG. 6 is a timing chart of a pump-down signal of the half-rate charge pump circuit 20 of FIG. 3. In the graph of FIG. 6, time and supply voltage Vdd are taken as an abscissa axis and an ordinate axis, respectively. Meanwhile, FIGS. 7A and 7B show a NOR circuit and an AND circuit built in the half-rate charge pump circuit 20.

The charge pump circuit 20 includes a pump-up circuit 24, a first pump-down circuit 25 and a second pump-down circuit 26. The pump-up circuit 24 has a current switch 21, a first constant current source 22 and p-channel MOS transistors 31 and 32. The first pump-down circuit 25 has n-channel MOS transistors 33 to 35, while second pump-down circuit 26 has n-channel MOS transistors 36 to 38. The pump-up circuit 24 outputs a pump-up signal UP, while the first and second pump-down circuits 25 and 26 output pump-down signals DOWN1 and DOWN2, respectively.

The charge pump circuit 20 outputs the pump-up signal UP and the pump-down signals DOWN1 and DOWN2 to a low-pass filter (LPF) such that the phase of the half-rate clock CLK is aligned with that of the input signal Data. As shown in FIG. 4, the signals Y0 and Y6 have an identical waveform, while phase of the signal Y6 is synchronous with that of the half-rate clock CLK As shown in FIG. 7A, a NOR circuit can be formed by the n-channel MOS transistor 33 to 35 of the first pump-down circuit 25. Meanwhile, as shown in FIG. 7B, an AND circuit can be formed by the n-channel MOS transistors 36 and 38 of the second pump-down circuit 26. Furthermore, an exclusive OR circuit can be formed by the n-channel MOS transistors 33 to 38 of the first and second pump-down circuits 25 and 26. A logic circuit can also be formed by the p-channel MOS transistors of the pump-up circuit 24 instead of the n-channel MOS transistors of the first and second pump-down circuits 25 and 26. As shown in FIG. 4, phase of the input signal Data deviates from that of the half-rate clock CLK by a half period at the time the phase detector 10 has been locked.

In the half-rate CDR circuit of the above described configuration, frequency of a voltage controlled oscillator (VCO) (not shown) rises and drops in response to rise and drop of a control voltage inputted from the LPF, respectively. If the input signal Data has been inputted in such a continuous pattern of high and low levels as "HLHL . . .", the signals Y0 and Y6 have waveforms shown in FIG. 4. When the signal Y0 has changed from low level to high level, the pump-down signal DOWN 1 rises. On the other hand, when the signal Y0 has changed from high level to high level, the pump-down signal DOWN 2 rises. As shown in FIG. 5, by fixing phase of the input signal Data, pulse widths of the pump-down signals DOWN1 and DOWN2 are fixed at the side of an edge E2 and vary at the side of an edge E1.

Therefore, if the phase of the half-rate clock CLK lags behind that of the input signal Data, namely, is shifted rightwards in FIG. 5, the pulse widths of the pump-down signals DOWN1 and DOWN2 increase. On the contrary, if the phase of the half-rate clock CLK precedes that of the input signal Data, namely, is shifted leftwards in FIG. 5, the pulse widths of the pump-down signals DOWN1 and DOWN2 decrease. In short, the pulse widths of the half-rate clock CLK vary in accordance with the phase of the half-rate clock CLK. This is phase comparison principle of the half-rate CDR circuit of FIG. 3.

On the other hand, data pattern of the reference signal Y5 is identical with that of the pump-down signals DOWN 1 and DOWN2 and a pulse period of the reference signal Y5 is twice that of the pump-down signals DOWN1 and DOWN2. Meanwhile, since both of opposite edges E3 and E4 of a pulse width of the reference signal Y5 are synchronous with the half-rate clock CLK, pulse of the reference signal Y5 rises at all times at a pulse width corresponding to a half period of the half-rate clock CLK The pump-up signal UP is outputted by the pump-up circuit 24 on the basis of the reference signal Y5. Thus, phase of the reference signal Y5 can be adjusted by the pump-up signal UP and the pump-down signals DOWN1 and DOWN2. Meanwhile, since a pulse width of the pump-up signal UP is different from those of the pump-down signals DOWN1 and DOWN2, electric current 11 of the first constant current source 22 and electric current 12 of the second constant current source 23 are set so as to satisfy the relation of (I1/I2=½).

In order to form the above described logic circuits in the charge pump circuit 20, input levels of the signals Y0 and Y6 are changed as shown in FIG. 6. When the signal Y6 is turned on by the pump-down signal DOWN1, voltage of a node N1 in FIG. 3 rises to high level and the pump-down signal DOWN 1 does not flow irrespective of input of the signal Y0. If the signal Y6 is turned off as shown in FIG. 5, the pump-down signal DOWN1 flows upon turning on of the signal Y0 but does not flow upon turning off of the signal Y0.

In this embodiment, since the logic circuits are built in the half-rate charge pump circuit 20 of the half-rate CDR circuit, full-rate input is not required for full-rate output of the half-rate charge pump circuit 20 and the half-rate charge pump circuit 20 is capable of outputting at a full rate in response to half-rate input, so that operating margin of the half-rate CDR circuit can be increased.

(Third Embodiment)

FIG. 8 is a circuit diagram of a half-rate charge pump circuit 40 employed in a half-rate CDR circuit according to a third embodiment of the present invention. The half-rate charge pump circuit 40 has a configuration substantially similar to that of the half-rate charge pump circuit 20 of FIG. 3 and an amplifier circuit 50 for adjusting voltage level of the half-rate charge pump circuit 40 is connected to a p-channel MOS transistor 41 of the half-rate charge pump circuit 40. The amplifier circuit 50 is provided for reducing unnecessary off-leak current at the current switch 21 in the half-rate charge pump circuit 40 during operation of the half-rate CDR circuit. The off-leak current indicates drain current flowing when the gate potential is 0 V.

When the signal Y6 has been turned on, the pump-down signal DOWN1 should not flow essentially regardless of whether the signal Y0 is in ON state or OFF state. However, in case an amplifier circuit for adjusting voltage level of a charge pump circuit is not provided for the charge pump circuit, the node N1 of FIG. 3 rises to the supply voltage Vdd when the signal Y0 has been turned on. Thus, when the signal Y0 has been turned on, a voltage level of the node N1 rises higher than that of a node N2 of FIG. 3, so that electric current flows from the node N1 to the node N2.

The amplifier circuit 50 is provided for preventing the above described flow of electric current from the node N1 to the node N2. In FIG. 8, a voltage level of a node N3 becomes identical with that of a node N4. Thus, even if the signals Y0 and Y6 have been turned on, the voltage level of the node N3 is identical with that of the node N4 at all times, a voltage level of a node N5 does not become higher than that of the node N4 and thus, unnecessary off-leak current does not flow. This is applied to not only the n-channel MOS transistors for the pump-down signals DOWN1 and DOWN2 but the p-channel MOS transistors for the pump-up signal UP.

In this embodiment, since the amplifier circuit 50 for adjusting the voltage level of the half-rate charge pump circuit 40 is provided for the half-rate charge pump circuit 40, unnecessary off-leak current at the current switch 21 of the half-rate charge pump circuit 40 during operation of the half-rate CDR circuit is lessened.

(Fourth Embodiment)

Figure 9:
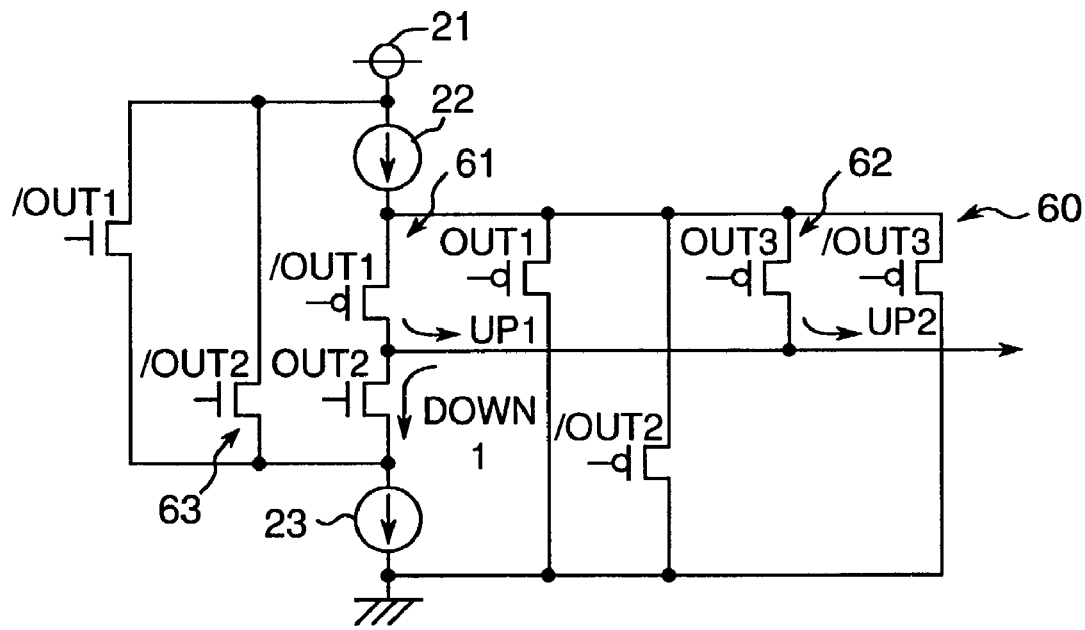
FIG. 9 is a circuit diagram of a half-rate charge pump circuit employed in a half-rate CDR circuit according to a fourth embodiment of the present invention.
Figure 10:
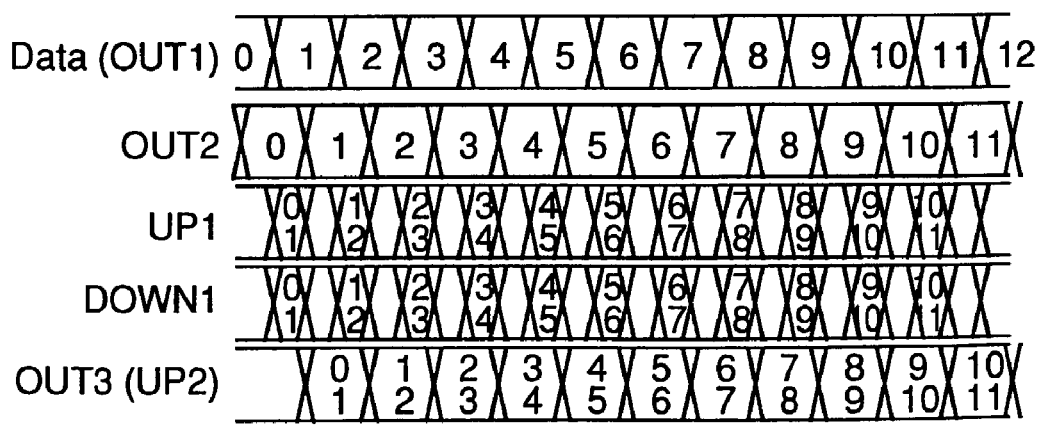
FIG. 10 is a timing chart of signals of the half-rate charge pump circuit of FIG. 9.
Figure 12A:
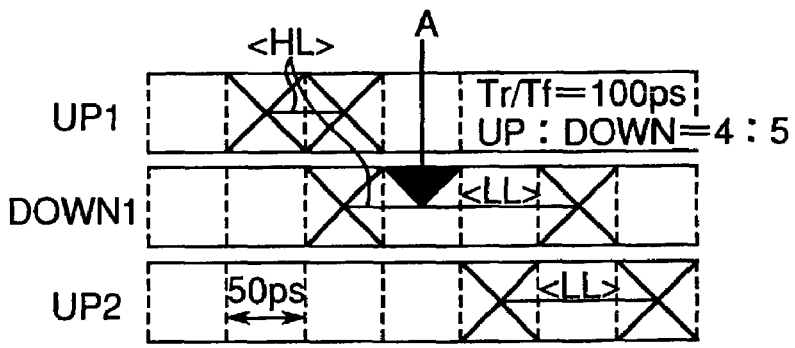
FIGS. 12A and 12B are timing charts of signals of the half-rate charge pump circuit of FIG. 9.
Figure 12B:
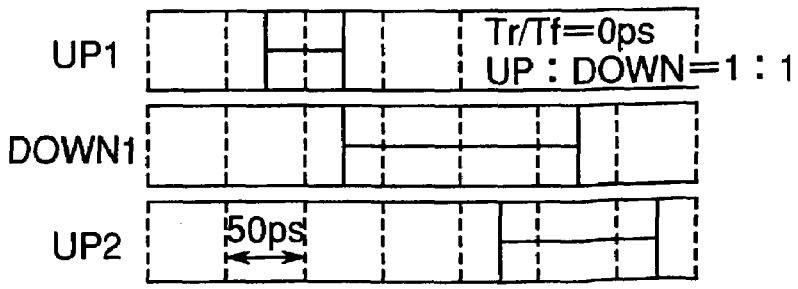
Figure 13:
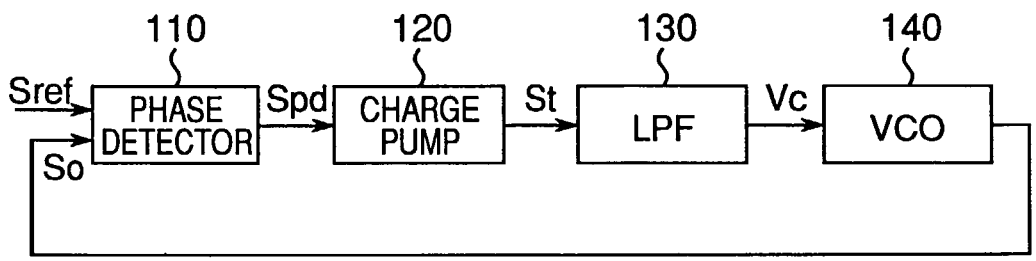
FIG. 13 is a block diagram showing a configuration of a prior art CDR circuit.

FIG. 9 is a circuit diagram of a half-rate charge pump circuit 60 employed in a half-rate CDR circuit according to a fourth embodiment of the present invention and FIGS. 10, 12A and 12B are timing charts of signals of the half-rate charge pump circuit 60 of FIG. 9. The half-rate charge pump circuit 60 includes first and second pump-up circuits 61 and 62 each having two p-channel MOS transistors and a pump-down circuit 63 having three n-channel MOS transistors. Since other configurations of the half-rate charge pump circuit 60 are similar to those of the half-rate charge pump circuit 20 of FIG. 3, the description is abbreviated for the sake of brevity.

The first and second pump-up circuits 61 and 62 output pump-up signals UP1 and UP2, respectively, while the pump-down circuit 63 outputs a pump-down signal DOWN1. In the half-rate charge pump circuit 60, on-state periods of the pump-up signals UP1 and UP2 and the pump-down signal DOWN1 are set relative to that of the input signal Data such that dependence of the pump-up signals UP1 and UP2 and the pump-down signal DOWN1 on the input signal Data wanes.

The half-rate CDR circuits of FIGS. 1 and 3 are capable of operating at the half-rate but output of the charge pump circuit is influenced by input pattern in case ratio of rise time Tr to fall time Tf, i.e., (Tr/Tf), which corresponds to the half rate substantially, is taken into consideration. The half-rate charge pump circuit 60 of FIG. 9 functions to minimize influences of the input pattern even if the half-rate charge pump circuit 60 has the substantially half-rate ratio of (Tr/Tf).

Figure 11A:
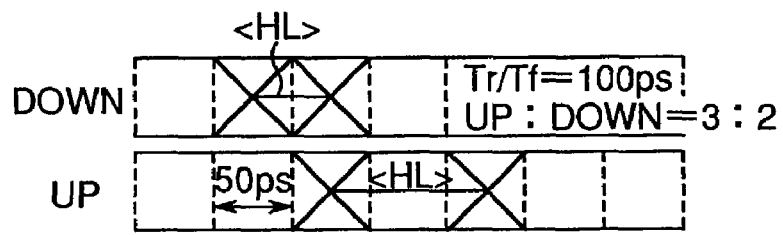
FIGS. 11A, 11B and 11C are timing charts of signals of a charge pump circuit as a comparative example of the half-rate charge pump circuit of FIG. 9.
Figure 11B:
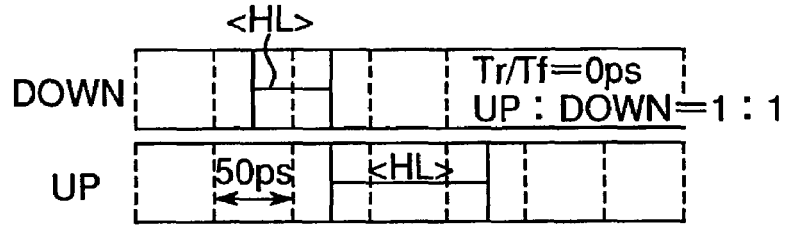
Figure 11C:
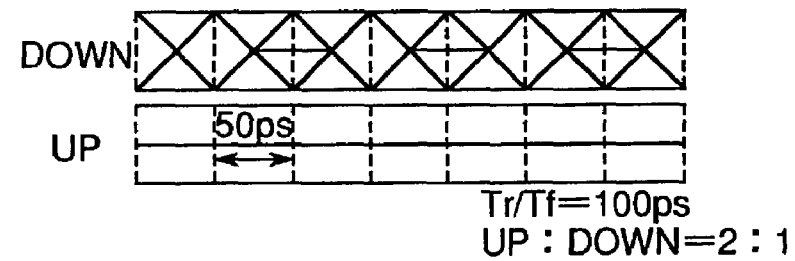

In comparison with the function of the half-rate charge pump circuit 60 of FIG. 9, a function of a charge pump circuit whose output greatly depends on the input pattern, for example, the half-rate charge pump circuit 20 of FIG. 3 is described with reference to timing charts of FIGS. 11A to 11C. In FIGS. 11A to 11C, when on-state periods of a pump-up signal UP and a pump-down signal DOWN are compared with each other, a quantity of electric current of the pump-down signal DOWN is set twice that of the pump-up signal UP such that the on-state period of the pump-down signal DOWN is set twice, while the on-state period of the pump-up signal UP is maintained as it is.

As shown in FIG. 11B, in case the ratio of (Tr/Tf) is 0 picosecond (ps) in the charge pump circuit, ratio of the on-state period of the pump-up signal UP to that of the pump-down signal DOWN is 1, i.e., (UP: DOWN=1:1) by setting the on-state period of the pump-down signal DOWN twice under optimum conditions in which the input signal Data has such a pattern of high and low levels as "HLLLLL . . . ". As a result, the on-state period of the pump-up signal UP coincides with that of the pump-down signal DOWN.

However, in case, for example, the substantially half-rate ratio of (Tr/Tf) is 100 ps, an output pattern shown in FIG. 11A is obtained in which the pump-down signal DOWN rises by 50 ps at points of change from high level to low level or from low level to high level of the input signal Data, while the pump-up signal UP rises by 100 ps at points of change from high level to low level or from low level to high level. By setting the on-state period of the pump-down signal DOWN twice, the ratio of the on-state period of the pump-up signal UP to that of the pump-down signal DOWN is (3/2), i.e., (UP:DOWN=3:2), so that the on-state periods of the pump-up signal UP and the pump-down signal DOWN do not coincide with each other even if the pump-up signal UP and the pump-down signal DOWN are synchronous with each other.

Furthermore, under worst conditions of the charge pump circuit in which the input signal Data has such a continuous pattern of high and low levels as "HLHL . . ." as shown in FIG. 11C, the ratio of the on-state period of the pump-up signal UP to that of the pump-down signal DOWN is 2, i.e., (UP:DOWN=2:1).

On the other hand, as shown in FIG. 12A in the half-rate charge pump circuit 60 of the present invention, the pump-up signal UP1 rises at points of change from high level to low level of the input signal Data and the pump-down signal DOWN 1 rises at a point of change from high level to low level of the input signal Data and in such a continuous pattern of low levels of the input signal Data as "LL". In order to eliminate the continuous pattern of low levels of the input signal Data as "LL" in which the pump-down signal DOWN 1 rises, the pump-up signal UP2 is outputted at the time the continuous pattern of low levels of the input signal Data as "LL" appears.

Therefore, in case the ratio (Tr/Tf) is 0 ps under optimum conditions in which the input signal Data has such a continuous pattern of high and low levels as "HLHL . . . " as shown in FIG. 12B, the pump-down signal DOWN 1 and the pump-up signal UP2 eliminate each other as described above, so that the ratio of the pump-up signal UP1 to that of the pump-down signal DOWN1 is 1, i.e., (UP1:DOWN1=1: 1) is obtained and thus, the on-periods of the pump-up signal UP1 and the pump-down signal DOWN1 coincide with each other.

Meanwhile, under worst conditions in which the input signal Data has such a continuous pattern of high and low levels as "HLLHLL . . . " indicated by the line A of FIG. 12A in case the substantially half-rate ratio (Tr/Tf) is 100 ps as shown in FIG. 12B, the pump-down signal DOWN 1 rises continuously, so that the pump-down signal DOWN1 and the pump-up signal UP2 eliminate each other as described above and thus, the ratio of the on-state period of the pump-up signal UP1 to that of the pump-down signal DOWN1 is (4/5), i.e., (UP1:DOWN1=4:5).

Under worst conditions in the half-rate charge pump circuit 60, the ratio of the pump-up signal to that of the pump-down signal, which indicates dependence of output on the input pattern, is (4/5) more approximate to 1 in comparison with 2 of FIG. 11C in the charge pump circuit in which dependence of output on the input pattern is not lessened, so that dependence of output on the input pattern is lessened.

In this embodiment, since dependence of output on the input pattern is lessened in the half-rate charge pump circuit 60, output of the half-rate charge pump circuit 60 is least likely to be influenced by the input pattern.

As is clear from the foregoing description of the half-rate CDR circuit of the present invention, since the half-rate CDR circuit includes the phase detector which is capable of operating at the half rate, the charge pump circuit, the low-pass filter and the voltage controlled oscillator and the phase detector includes the first latch circuit which receives the input signal, the inverted input signal and the half-rate clock so as to output the first output signal and the inverted first output signal, the second latch circuit which receives the first output signal and the inverted first output signal from the first latch circuit and the inverted half-rate clock so as to output the second output signal and the inverted second output signal, the further first latch circuit which receives the input signal, the inverted input signal and the inverted half-rate clock so as to output the further first output signal and the inverted further first output signal, the further second latch circuit which receives the further first output signal and the inverted further first output signal form the further first latch circuit and the half-rate clock so as to output the further second output signal and the inverted further second output signal, the selector circuit which receives the first output signal and the inverted first output signal form the first latch circuit and the further first output signal and the inverted further first output signal from the further first latch circuit, the half-rate clock and the inverted half-rate clock so as to output the retimed signal and the inverted retimed signal and the exclusive OR circuit which receives the second output signal and the inverted second output signal from the second latch circuit and the further second output signal and the inverted further second output signal from the further second latch circuit so as to output the reference signal and the inverted reference signal, the phase detector is capable of operating at the half rate, so that operating margin of the half-rate CDR circuit can be increased.

Meanwhile, since the charge pump circuit includes the current switch for outputting the signal to the low-pass filter, the pump-up circuit which includes a plurality of the p-channel MOS transistors so as to output the pump-up signal, the first pump-down circuit which includes a plurality of the first n-channel MOS transistors so as to output the first pump-down signal, the second pump-down circuit which includes a plurality of the second n-channel MOS transistors so as to output the second pump-down signal and the constant current source which is connected to the current switch, the pump-up circuit, the first pump-down circuit and the second pump-down circuit, while the p-channel MOS transistors of the pump-up circuit and the first and second n-channel MOS transistors of the first and second pump-down circuits form the logic circuits such that the charge pump circuit is capable of yielding the full-rate output in response to the half-rate input, the full-rate input is not required for full-rate output of the charge pump circuit, so that the charge pump circuit is capable of outputting at the full rate in response to the half-rate input and thus, operating margin of the half-rate CDR circuit can be increased.

Furthermore, since the amplifier circuit for adjusting the voltage level of the charge pump circuit is connected to the charge pump circuit so as to lessen unnecessary off-leak current at the charge pump circuit during operation of the half-rate CDR circuit, unnecessary off-leak current at the current switch of the current switch of the charge pump circuit during operation of the half-rate CDR circuit is lessened.

Moreover, since the charge pump circuit includes the current switch for outputting the signal to the low-pass filter, the first pump-up circuit which includes a plurality of the first p-channel MOS transistors so as to output the first pump-up signal, the second pump-up circuit which includes a plurality of the second p-channel MOS transistors so as to output the second pump-up signal, the pump-down circuit which includes a plurality of the n-channel MOS transistors so as to output the pump-down signal and the constant current source which is connected to the current switch, the first pump-up circuit, the second pump-up circuit and the pump-down circuit, while in case the substantially half-rate ratio of the rise time to the fall time exists, the on-state periods of the first and second pump-up signals and the pump-down signal are set relative to the input signal such that the ratio of the sum of the on-state periods of the first and second pump-up signals to the on-state period of the pump-down signal is approximate to one, output of the charge pump circuit is least likely to be influenced by the input pattern.

What is claimed is:

1. A half-rate clock and data recovery (CDR) circuit comprising:
  a phase detector capable of operating at a half rate;
  a charge pump circuit;
  a low-pass filter; and
  a voltage controlled oscillator, the phase detector comprising:
    a first latch circuit which receives an input signal, an inverted input signal, and a half-rate clock and outputting a first output signal and an inverted first output signal;
    a second latch circuit which receives the first output signal and the inverted first output signal from the first latch circuit and an inverted half-rate clock and outputs a second output signal and an inverted second output signal;
    a further first latch circuit which receives the input signal, the inverted input signal, and the inverted half-rate clock and outputs a further first output signal and an inverted further first output signal;
    a further second latch circuit which receives the further first output signal and the inverted further first output signal form the further first latch circuit and the half-rate clock and outputs a further second output signal and an inverted further second output signal;

a selector circuit which receives the first output signal and the inverted first output signal form the first latch circuit and the further first output signal and the inverted further first output signal from the further first latch circuit, the half-rate clock, and the inverted half-rate clock and outputs a retimed signal and an inverted retimed signal; and an exclusive OR circuit which receives the second output signal and the inverted second output signal from the second latch circuit and the further second output signal and the inverted further second output signal from the further second latch circuit and outputs a reference signal and an inverted reference signal.

2. A half-rate CDR circuit according to claim 1, the charge pump circuit comprises:

a current switch for outputting a signal to the low-pass filter;

a pump-up circuit which includes a plurality of p-channel MOS transistors and outputs a pump-up signal;

a first pump-down circuit which includes a plurality of first n-channel MOS transistors and outputs a first pump-down signal;

a second pump-down circuit which includes a plurality of second n-channel MOS transistors and outputs a second pump-down signal; and a constant current source which is connected to the current switch, the pump-up circuit, the first pump-down circuit, and the second pump-down circuit, wherein the p-channel MOS transistors of the pump-up circuit and the first and second n-channel MOS transistors of the first and second pump-down circuits form logic circuits such that the charge pump circuit produces a full-rate output in response to a half-rate input.

3. A half-rate CDR circuit according to claim 2, including an amplifier circuit for adjusting a voltage level of the charge pump circuit connected to the charge pump circuit to lessen off-leakage current at the current switch of the charge pump circuit during operation of the half-rate CDR circuit.

4. A half-rate CDR circuit according to claim 1, the charge pump circuit comprises:

a current switch for outputting a signal to the low-pass filter;

a first pump-up circuit which includes a plurality of first p-channel MOS transistors and outputs a first pump-up signal;

a second pump-up circuit which includes a plurality of second p-channel MOS transistors and outputs a second pump-up signal;

a pump-down circuit which includes a plurality of n-channel MOS transistors and outputs a pump-down signal; and a constant current source which is connected to the current switch, the first pump-up circuit, the second pump-up circuit and the pump-down circuit, wherein when a substantially half-rate ratio of a rise time to fall time exists, on-state periods of the first and second pump-up signals and the pump-down signal are set relative to the input signal so that a ratio of a sum of the on-state periods of the first and second pump-up signals to the on-state period of the pump-down signal is approximately one.

* * * * *